United States Patent [19]

Baskett

[11] Patent Number: 4,730,130
[45] Date of Patent: Mar. 8, 1988

[54] WRITABLE ARRAY LOGIC

[75] Inventor: Ira E. Baskett, Tempe, Ariz.

[73] Assignee: Motorola, Inc., Schaumburg, Ill.

[21] Appl. No.: 492

[22] Filed: Jan. 5, 1987

[51] Int. Cl.$^4$ .................................. H03K 19/177
[52] U.S. Cl. .................... 307/466; 307/455; 307/467; 307/463; 364/716; 365/189
[58] Field of Search .............. 365/155, 179, 189; 364/716; 307/465–467, 455, 530, 463

[56] References Cited

U.S. PATENT DOCUMENTS

| | | | |
|---|---|---|---|
| 3,818,452 | 6/1974 | Greer | 340/166 |
| 4,124,899 | 11/1978 | Birkner et al. | 364/716 |
| 4,177,452 | 12/1979 | Balasubramanian et al. | 340/166 R |
| 4,311,926 | 1/1982 | Patel et al. | 307/466 |
| 4,313,106 | 1/1982 | Hsu | 340/825.91 |
| 4,336,601 | 6/1982 | Tanaka | 364/900 |
| 4,458,163 | 7/1984 | Wheeler et al. | 307/466 |
| 4,488,246 | 12/1984 | Brice | 307/465 X |
| 4,490,812 | 12/1984 | Guterman | 364/900 |
| 4,495,427 | 1/1985 | Cartwright | 307/469 |
| 4,508,977 | 4/1985 | Page et al. | 364/716 X |
| 4,524,430 | 6/1985 | Page | 365/189 |
| 4,546,273 | 10/1985 | Osman | 364/716 X |
| 4,578,771 | 3/1986 | O'Hara, Jr. | 364/716 |
| 4,583,012 | 4/1986 | Smith et al. | 307/465 |
| 4,584,682 | 4/1986 | Shah et al. | 371/10 |
| 4,617,479 | 10/1986 | Hartmann et al. | 364/716 X |
| 4,617,649 | 10/1986 | Kyomasu et al. | 365/189 |

FOREIGN PATENT DOCUMENTS 0121534 10/1978 Japan .................................. 364/716

OTHER PUBLICATIONS

Marchand, "An Alterable Programmable Array", Solid-State Circuits, vol. SC-20, No. 5, Oct. 1985, pp. 1061-1066.

Landry, "Application-Specific ICs, Relying on RAM, Implement Almost Any Logic Function", Electronic Design, Oct. 31, 1985, pp. 123-130.

Patil et al., "A Programmable Logic Approach for VLSI, IEEE Transactions on Computers, vol. C-28, No. 9, Sep. 1979, pp. 594-601.

Primary Examiner—Stanley D. Miller
Assistant Examiner—D. R. Hudspeth
Attorney, Agent, or Firm—William E. Koch

[57] ABSTRACT

A bipolar writable array logic device is provided having an output representing a logical AND function and a logical OR function in response to a plurality of input signals. An AND matrix decode and an OR matrix decode are coupled to an input circuit for separately decoding a plurality of input signals. An array of collector sensed memory cells is coupled to the AND matrix decode for selecting desired rows of the collector sensed memory cells. A first plurality of sense amplifiers are coupled between the OR matrix decode and columns of the collector sensed memory cells for providing an ANDed output. Rows of an array of emitter sensed memory cells are coupled to the first plurality of sense amplifiers. A second plurality of sense amplifiers are coupled to columns of the emitter sensed memory cells for providing the bipolar writable array logic device output.

18 Claims, 7 Drawing Figures

Ratable Array Logic

WRITABLE ARRAY LOGIC

FIELD OF THE INVENTION

This invention relates in general to logic arrays and, more particularly, to bipolar writable logic arrays that may be quickly programmed and reprogrammed electrically.

BACKGROUND OF THE INVENTION

Programmable memory circuits have been developed from the basic ROM (Read Only Memory) including the PROM (Programmable Read Only Memory: OR terms field programmable and AND terms fixed), EPROM (Electrically Programmable Read Only Memory: OR terms field programmable and AND terms fixed), and EEPROM (Electrically Erasable Programmable Read Only Memory: OR terms field programmable).

Likewise, many types of integrated circuit programmable logic devices have been developed. Early types of programmable logic devices included PLAs (Programmable Logic Arrays: AND and OR terms factory programmable) that are mask-programmable, and FPLAs (Field Programmable Logic Arrays: AND and OR terms field programmable) that can be programmed in the field instead of at manufacture. Other types of programmable logic arrays that have evolved include HAL (Hardware Array Logic: AND terms factory programmed, OR terms fixed), IFL (Integrated Fused Logic: AND and OR terms field programmable), FPLS (Field Programmable Logic Sequencer: AND and OR terms field programmable with output to input feedback), FPGA (Field Programmable Gate Array: AND terms field programmable and no OR terms), EPLD (Electrically Programmable Logic Devices: EPROM Cell), EEPLD/PEEL (Electrically Erasable Programmable Logic Devices: EEPROM Cell), and GAL (Generic Array Logic: AND terms field programmable, fixed OR array—EEPROM Cell).

However, most of the above programmable logic devices do not provide a programmable logic array in which both the AND and OR functions may be programmed and reprogrammed in the field.

Of the above types of PLDs, only the EPLDs may have both the AND and OR terms programmed and reprogrammed electrically without a definite erasing step. One type of device that provides this capability is described in "An Alterable Programmable Logic Array", IEEE JOURNAL OF SOLID-STATE CIRCUITS, Vol. SC-20, No. 5, page 1061, October 1985. An NMOS alterable programmable logic array performs the same logical function as a standard programmable logic device, but can be programmed and reprogrammed electrically to change the logic function. However, this alterable programmable logic array requires a refresh cell for each row and column and is slow due to the capacitance within the MOS circuitry.

Thus, what is needed is a bipolar writable logic array that may be quickly programmed and reprogrammed electrically.

SUMMARY OF THE INVENTION

Accordingly, it is an object of the present invention to provide an improved programmable logic device.

Another object of the present invention is to provide a bipolar programmable logic device that may be electrically programmed and reprogrammed quickly.

Still another object of the present invention is to provide a bipolar programmable logic device that may be electrically programmed and reprogrammed quickly while in use.

In carrying out the above and other objects of the invention in one form, there is provided a bipolar writable array logic device having an output representing a logical AND function and a logical OR function in response to a plurality of input signals. An AND matrix decode and an OR matrix decode are coupled to an input circuit for separately decoding a plurality of input signals. An array of collector sensed memory cells is coupled to the AND matrix decode for selecting desired rows of the collector sensed memory cells. A first plurality of sense amplifiers are coupled between the OR matrix decode and columns of the collector sensed memory cells for providing an ANDed output. Rows of an array of emitter sensed memory cells are coupled to the first plurality of sense amplifiers. A second plurality of sense amplifiers are coupled to columns of the emitter sensed memory cells for providing the bipolar writable array logic device output.

The above and other objects, features, and advantages of the present invention will be better understood from the following detailed description taken in conjunction with the accompanying drawings.

DETAILED DESCRIPTION OF THE INVENTION

Figure 1A:
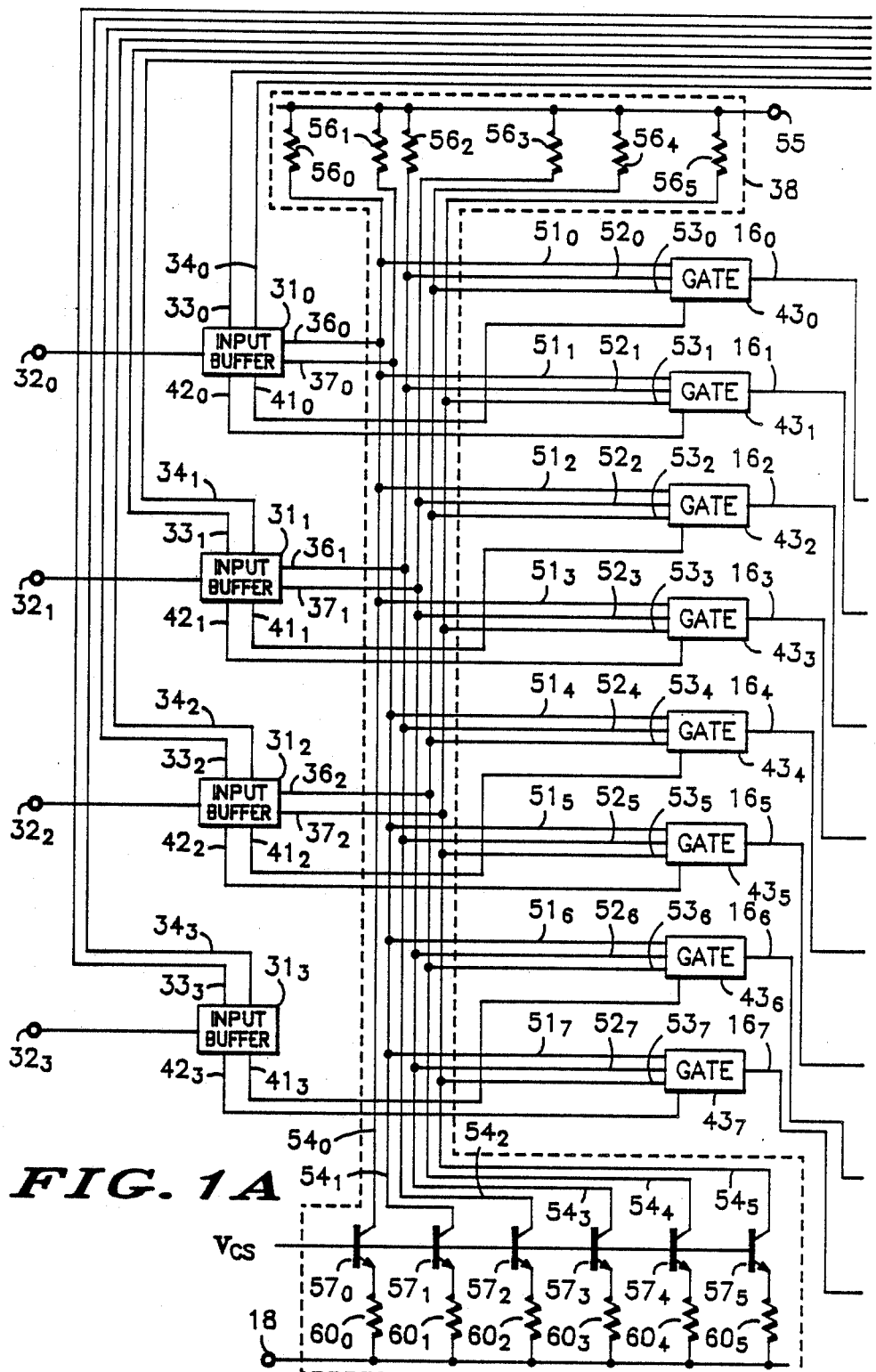
FIG. 1A and 1B is a partial block diagram of the present invention.
Figure 1B:
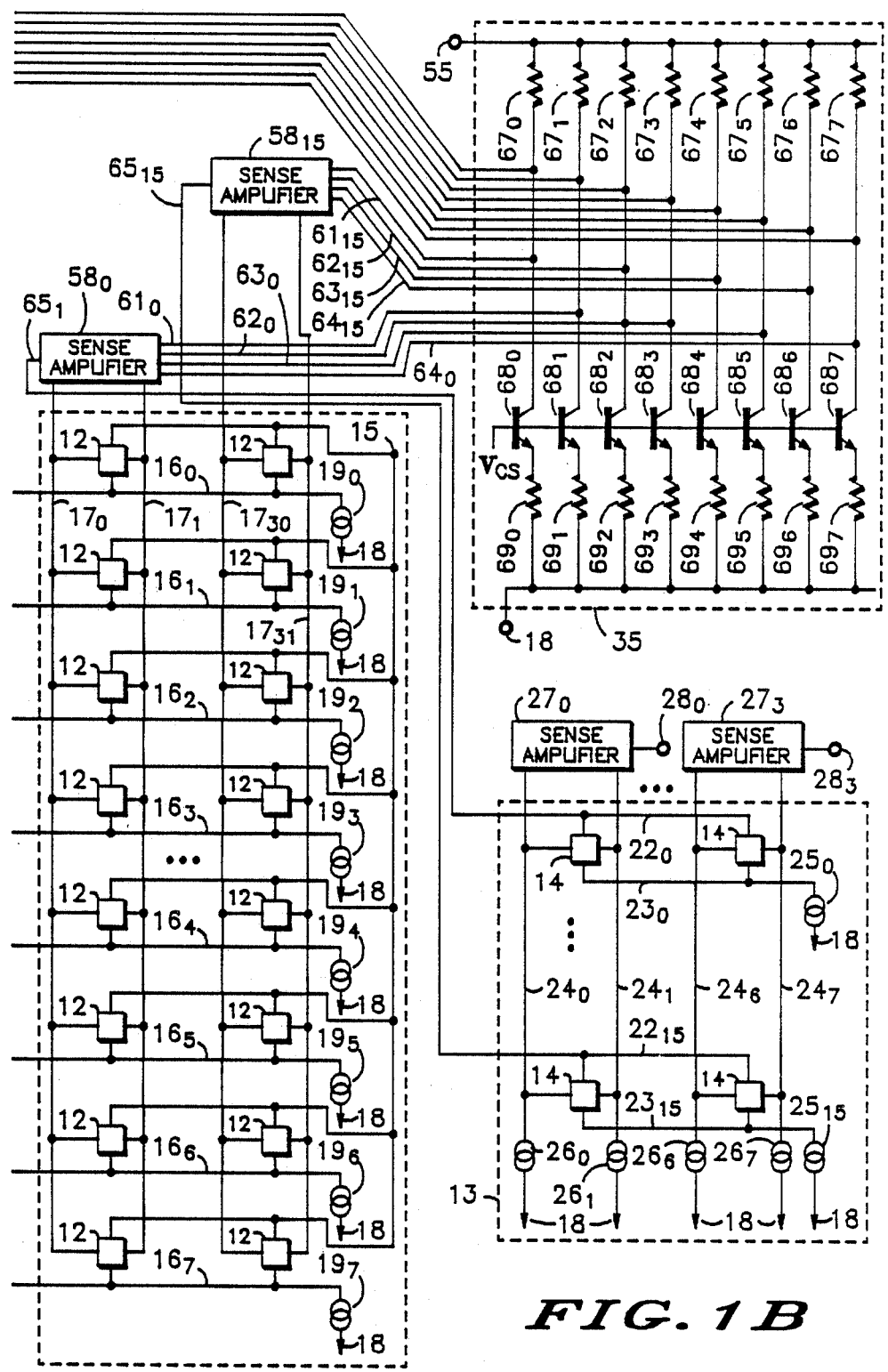
Figure 5:
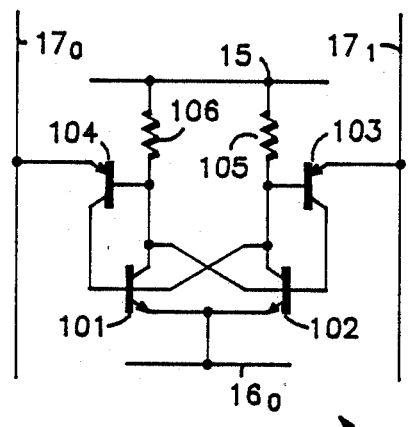
FIG. 5 is a schematic of a collector sensed memory cell used in the present invention.

Referring to FIG. 1, the writable array logic of the present invention provides for real time reprogrammable AND and OR functions and includes AND matrix 11 comprising memory cells 12, and OR matrix 13 comprising memory cells 14. Each of memory cells 12 are coupled in one of eight rows between upper word line 15 at a supply voltage such as $V_{CC}$ and one of lower word lines $16_0$ through $16_7$, and coupled in one of sixteen columns between one of a pair of bit lines $17_0$ through $17_{31}$. Each of lower word lines $16_0$ through $16_7$ are coupled to supply voltage terminal 18 by standby current sources $19_0$ through $19_7$, respectively, for sinking current therethrough. One embodiment representing memory cell 12 is illustrated in FIG. 5 and will be described in greater detail hereinafter.

Figure 6:
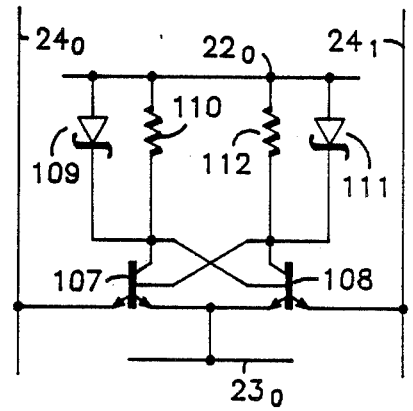
FIG. 6 is a schematic of an emitter sensed memory cell used in the present invention.

Each of memory cells 14 are coupled in one of sixteen rows between upper word lines $22_0$ through $22_{15}$ and one of sixteen lower word lines $23_0$ through $23_{15}$, respectively, and coupled in one of four columns between one of a pair of bit lines $24_0$ through $24_7$. Each of lower word lines $23_0$ through $23_{15}$ are coupled to voltage terminal 18 by standby current sources $25_0$ through $25_{15}$, respectively, for sinking current therethrough. Each of bit lines $24_0$ through $24_7$ are coupled to voltage terminal 18 by current sources $26_0$ through $26_7$, respectively, and in successive pairs to OR matrix sense amplifiers $27_0$ through $27_3$, respectively. Sense amplifiers $27_0$ through $27_3$ are each coupled to output terminals $28_0$ through $28_3$ for providing the circuit output. One embodiment representing memory cell 14 is illustrated in FIG. 6 and will be described in greater detail hereinafter.

Figure 2:
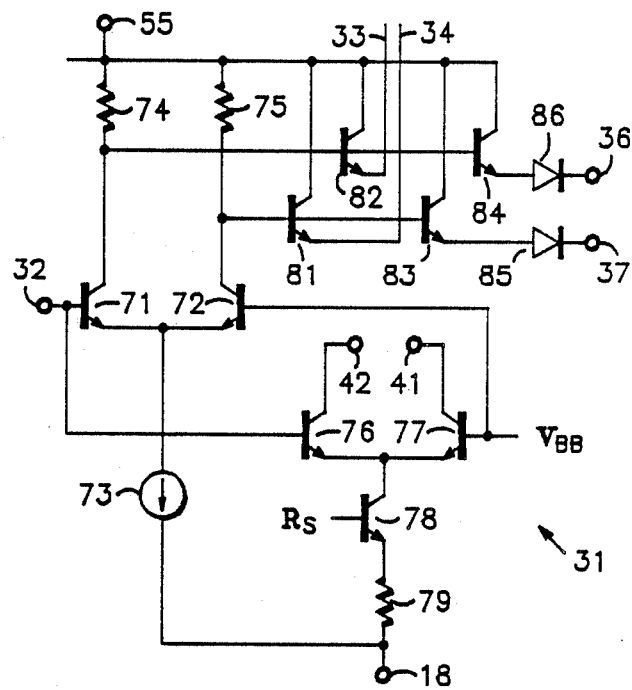
FIG. 2 is a schematic of an input buffer for the present invention.

Input buffers $31_0$ through $31_3$ are each coupled to one of input terminals $32_0$ through $32_3$, respectively. Each of input buffers 31 has a first pair of outputs 33 and 34 coupled to OR matrix decode 35. Each of input buffers $31_0$ through $31_2$ have a second pair of outputs 36 and 37 connected to AND matrix decode 38. Input buffer $31_0$ has read lines $41_0$ and $42_0$ connected to AND matrix decode gates $43_0$ and $43_1$, respectively. Each of succeeding input buffers $31_1$ through $31_3$ has a pair of read lines $41_1$ and $42_1$, $41_2$ and $42_2$, and $41_3$ and $42_3$ similarly connected to AND matrix decode gates $43_2$ through $43_7$, respectively. One embodiment representing input buffer 31 is illustrated in FIG. 2 and will be described in greater detail hereinafter.

Figure 3:
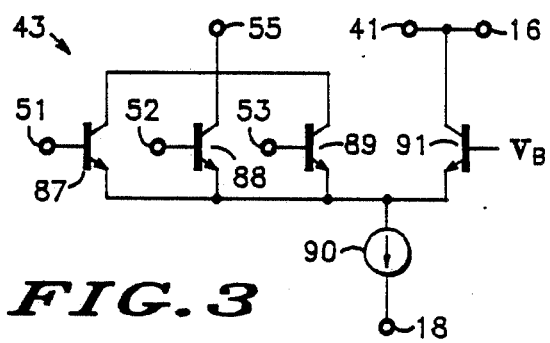
FIG. 3 is a schematic of a logic gate used in the present invention.

Each of AND matrix decode gates 43 has inputs 51, 52, and 53 connected to AND matrix decode 38, and an output connected to one of lower word lines 16 of AND matrix 11. One embodiment representing AND matrix decode gate 43 is illustrated in FIG. 3 and will be described in greater detail hereinafter.

AND matrix decode 38 comprises six columns having nodes $54_0$ through $54_5$ coupled to voltage terminal 55 by resistors $56_0$ through $56_5$, respectively, and to voltage terminal 18 by write selectable current sources $57_0$ through $57_5$ and resistors $60_0$ through $60_5$, respectively. Nodes $54_0$ through $54_5$ are uniquely connected to the combination of outputs $36_0$ through $36_2$ and $37_0$ through $37_2$ and inputs $51_0$ through $51_7$, $52_0$ through $52_7$ and $53_0$ through $53_7$ for providing the decoding function to select the desired AND matrix decode gates $43_0$ through $43_7$ depending on the input signals applied to input terminals 32.

Figure 4:
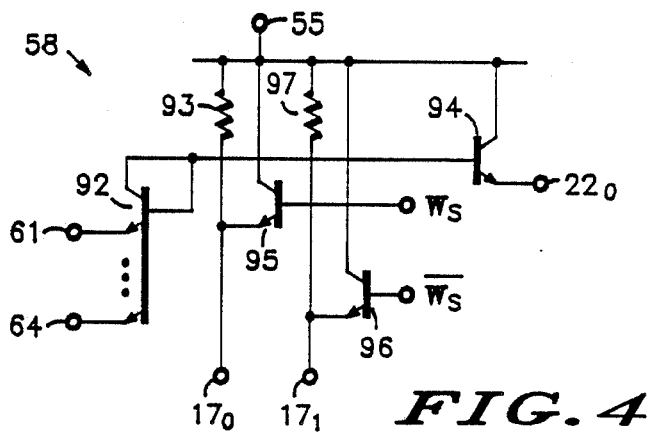
FIG. 4 is a schematic of a sense amplifier used in the present invention.

AND matrix sense amplifiers $58_0$ through $58_{15}$ are each coupled to one of the pair of bit lines $17_0$ and $17_1$ through $17_{30}$ and $17_{31}$, respectively, for sensing the current therein. Each of AND matrix sense amplifiers 58 has inputs 61, 62, 63 and 64 connected to OR matrix decode 35, and a product line output 65 connected to upper word line 22 of OR matrix 13. One embodiment representing AND matrix sense amplifier 58 is illustrated in FIG. 4 and will be described in greater detail hereinafter.

OR matrix decode 35 comprises eight columns having nodes $66_0$ through $66_7$ coupled to voltage terminal 55 by resistors $67_0$ through $67_7$, respectively, and to voltage terminal 18 by write selectable current sources $68_0$ through $68_7$ and resistors $70_0$ through $70_7$, respectively. Nodes $66_0$ through $66_7$ are uniquely connected to the combination of outputs 33 and 34 from each input buffer $31_0$ through $31_3$ and inputs 61 through 64 to each of AND matrix sense amplifiers $58_0$ through $58_{15}$ for providing the decoding function to select the desired AND matrix sense amplifier 58 depending on the input signals applied to input terminals 32. In the read mode, input buffer 31 selects the desired rows of AND matrix 11 through the AND matrix read lines 41 and 42. The information stored in AND matrix 11 is "ANDed" at AND matrix sense amplifiers 58, which selects or deselects rows in OR matrix 13. The information stored in OR matrix 13 is "ORed" at sense amplifiers 27 and is presented as an output at terminals 28.

Referring to FIG. 2, input buffer 31 comprises differentially connected transistors 71 and 72 having their emitters coupled to voltage terminal 18 by current source 73, and their collectors coupled to voltage terminal 55 by resistors 74 and 75, respectively. Differentially connected transistors 76 and 77 have their emitters connected to the collector of current source transistor 78, and their collectors coupled as read lines 41 and 42 to AND matrix decode gate 43. Transistor 78 has an emitter coupled to voltage terminal 18 by resistor 79, and a base coupled to receive read signal $R_S$. The bases of transistors 71 and 76 are connected to input terminal 32 and the bases of transistors 72 and 77 are coupled to receive bias voltage $V_{BB}$. Emitter follower transistors 81 and 82 have their collectors connected to voltage terminal 55, their bases connected to the collectors of transistors 72 and 71, respectively, and their emitters coupled to OR matrix decode 35. Emitter follower transistors 83 and 84 have their collectors connected to voltage terminal 55, their bases connected to the collectors of transistors 72 and 71, respectively, and their emitters coupled to AND matrix decode 38 by diodes 85 and 86, respectively. Input buffer 31 performs multiple functions. It addresses both AND matrix decode 38 and OR matrix decode 35 individually for writing and selects half of AND matrix decode 38 for reading out the composite logic operation. Transistors 71 and 72 comprise an ECL logic gate that performs all the write addressing functions through transistors 81, 82, 83 and 84. Transistors 76 and 77 comprise an ECL logic gate that pulls down one of two rows for selecting a row of memory cells 12 of AND matrix 11. In order to disable the write addressing function, current sources 57 and 68 of AND matrix decode 38 and OR matrix decode 35, respectively, are disabled. This allows resistors 56 and 67 to pull nodes 54 and 66 to the voltage on terminal 55.

Referring to FIG. 3, AND matrix decode gate 43 comprises transistors 87, 88 and 89 having their collectors connected to voltage terminal 55, their emitters coupled to voltage terminal 18 by current source 90, and their bases connected to nodes 51, 52 and 53, respectively. Differentially connected transistor 91 has an emitter coupled to current source 90, a base coupled to receive bias voltage $V_B$, and a collector coupled to both lower word line 16 and read line 41. AND matrix decode gate 43 is actually an OR logic gate for decoding the rows of AND matrix 11 for the write operation.

Referring to FIG. 4, AND matrix sense amplifier 58 comprises diode connected multi-emitter transistor 92 having its base and collector coupled to voltage terminal 55 by resistor 93, to the base of transistor 94, the emitter of transistor 95, and to bit line $17_0$. Transistor 92 has each emitter connected to one of inputs 61 through 64. Transistor 94 has its collector connected to voltage terminal 55 and its emitter coupled to upper word line 22. Transistors 95 and 96 have their collectors connected to voltage terminal 55 and their bases coupled for receiving a differential write signal $W_S$ and $\overline{W}_S$. The emitter of transistor 96 is connected to bit line 171 and coupled to voltage terminal 55 by resistor 97. Resistors 93 and 97 are load resistors for bit lines or columns of AND matrix 11. Transistor 92 selects one of the rows of OR matrix 13 during the write operation. Transistors 95 and 96 "pull up" one of bit lines 17 for writing. During write, data is entered into the memory cell of a selected row by raising one of bit lines 17 of collector sensed memory cell 12 or lowering one of bit lines 24 of emitter sensed memory cell 14.

Referring to FIG. 5, one embodiment of memory cell 12 of AND matrix 11 comprises differentially connected transistors 101 and 102 having their emitters connected to lower word line 16 and their collectors cross-coupled to each others bases and to the collectors of transistors 103 and 104, respectively. Transistors 103 and 104 have their bases connected to the collectors of transistors 102 and 101, respectively, and coupled to upper word line 15 by resistors 105 and 106, respectively, and their emitters connected to bit lines $17_1$ and $17_0$, respectively. Memory cells 12 are collector sensed memory cells that provide the AND function for the circuit.

Referring to FIG. 6, one embodiment of memory cell 14 of OR matrix 13 comprises cross-coupled transistors 107 and 108 having a first emitter connected to lower word line $23_0$, a second emitter connected to bit lines $24_0$ and $24_1$, respectively, and their collectors connected to each others base. The collector of transistor 107 is further coupled to upper word line $22_0$ by schottky diode 109 and resistor 110. The collector of transistor 108 is further coupled to upper word line $22_0$ by schottky diode 111 and resistor 112. Memory cells 14 are emitter sensed memory cells that provide the OR function of the circuit.

By now it should be appreciated that that there has been provided a bipolar writable logic device that provides the ability to program new logic functions while in use by enabling either the AND matrix decode or the OR matrix decode and entering the desired data. The high speed bipolar implementation allows use as a discrete component or embedded in array devices.

I claim:

1. A bipolar writable array logic device providing a device output representing a logical AND function and a logical OR function in response to a plurality of input signals, said device comprising:
   first means for receiving said plurality of input signals;
   second means coupled to said first means for decoding said input signals;
   third means coupled to said first means for decoding said input signals;
   fourth means coupled to said second and third means for providing said logical AND function; and
   fifth means coupled to said fourth means for providing said logical OR function and providing said output, wherein said logical AND and logical OR function may be reprogrammed by said input signals.

2. The writable array logic device according to claim 1 wherein said fourth means comprises a plurality of collector sensed memory cells arranged in rows and columns, said second means selecting cells in desired rows in response to said input signals.

3. The writable array logic device according to claim 2 wherein said fourth means further comprises a first plurality of sense amplifiers, each of said first plurality of sense amplifiers coupled to one of said columns of collector sensed memory cells for sensing said selected cells, and coupled to said third means for selecting one of said first plurality of sense amplifiers in response to said input signals.

4. The writable array logic device according to claim 3 wherein said fifth means comprises a plurality of emitter sensed memory cells arranged in rows and columns, said first plurality of sense amplifiers selecting cells in desired rows of said emitter sensed memory cells.

5. The writable array logic device according to claim 4 wherein said fifth means further comprises a second plurality of sense amplifiers, each of said second plurality of sense amplifiers coupled to one of said columns of emitter sensed memory cells for sensing said selected cells and providing said device output.

6. The writable array logic device according to claim 5 wherein said first means comprises a plurality of input buffers, each of said input buffers coupled for receiving one of said input signals, coupled to said second means for providing a read signal thereto and coupled to said third means for providing a first pair of output signals thereto, and at least a portion of said plurality of input buffers coupled to said second means for providing a second pair of output signals thereto.

7. The writable array logic device according to claim 6 wherein each of said input buffers comprise:
   a first ECL gate coupled to and being biased by one of said input signals and providing said first and second pair of output signals; and
   a second ECL gate coupled to and being biased by said one of said input signals and coupled to said second means for providing at least one of said read signals thereto.

8. The writable array logic device according to claim 7 wherein said second means comprises:
   a decode circuit coupled to each of said first ECL gates for receiving said first pair of output signals; and
   a plurality of logic gates, each of said logic gates having a plurality of inputs coupled to said decode circuit, a read input coupled to one of said input buffers for receiving one of said read signals, and a gated output coupled to one of said rows of said collector sensed memory cells.

9. The writable array logic device according to claim 8 wherein said logic gate comprises:
   a current source;
   a plurality of transistors having bases individually coupled to said decode circuit as said plurality of inputs, collectors coupled to a first voltage, and emitters coupled to a second voltage by said current source; and
   a first transistor having a base coupled to a reference voltage, an emitter coupled to said emitters of said plurality of transistors, and a collector coupled to one of said rows of collector sensed memory cells and to one of said read signals.

10. The writable array logic device according to claim 9 wherein each of said sense amplifiers comprise:
    a first resistor;
    a multi-emitter transistor having a plurality of emitters coupled to said third means, and a base and a collector both coupled to a node;
    an emitter follower transistor having a base coupled to said node and coupled to said first voltage by said first resistor, a collector coupled to said first voltage, and an emitter coupled to one of said rows of said fifth means; and
    sixth means for disabling said sense amplifier coupled to said node and coupled for receiving a write signal.

11. The writable array logic device according to claim 6 wherein said second means comprises:

a decode circuit coupled to each of said first ECL gates for receiving said first pair of output signals; and a plurality of logic gates, each of said logic gates having a plurality of inputs coupled to said decode circuit, a read input coupled to one of said input buffers for receiving one of said read signals, and a gated output coupled to one of said rows of said collector sensed memory cells.

12. The writable array logic device according to claim 6 wherein said logic gate comprises:

a current source;

a plurality of transistors having bases individually coupled to said decode circuit as said plurality of inputs, collectors coupled to a first voltage, and emitters coupled to a second voltage by said current source; and a first transistor having a base coupled to a reference voltage, an emitter coupled to said emitters of said plurality of transistors, and a collector coupled to one of said rows of collector sensed memory cells and to one of said read signals.

13. The writable array logic device according to claim 6 wherein each of said sense amplifiers comprise:

a first resistor;

a multi-emitter transistor having a plurality of emitters coupled to said third means, and a base and a collector both coupled to a node;

an emitter follower transistor having a base coupled to said node and coupled to said first voltage by said first resistor, a collector coupled to said first voltage, and an emitter coupled to one of said rows of said fifth means; and sixth means for disabling said sense amplifier coupled to said node and coupled for receiving a write signal.

14. A bipolar writable array logic device providing a device output representing a logical AND function and a logical OR function, said device comprising:

a plurality of input terminals, each of said input terminals receiving one of a plurality of input signals;

first means coupled to said input terminals for decoding said input signals and providing a plurality of first decode signals and a plurality of second decode signals;

second means coupled to said first means for providing said logical AND function, said second means comprising an array of collector sensed memory cells arranged in rows and columns, wherein specific rows may be selected by said plurality of first decode signals;

a first plurality of sense amplifiers coupled to both said first means and said second means, each of said first plurality of sense amplifiers coupled to one of said columns of collector sensed memory cells and to one of said plurality of second decode signals and having an ANDed output signal; and third means for providing said device output coupled to said first plurality of sense amplifiers for providing said logical OR function, said third means comprising an array of emitter sensed memory cells arranged in rows and columns, wherein specific rows may be selected by said ANDed output signals.

15. The writable array logic device according to claim 14 wherein said first means comprises:

a plurality of input buffers, each of said input buffers coupled to one of said input terminals and providing a first pair of output signals, a second pair of output signals, and a read signal;

a first decode circuit coupled to each of said input buffers for receiving said first pair of output signals;

a second decode circuit coupled to each of said input buffers for receiving said second pair of output signals and providing said plurality of second decode signals; and a plurality of logic gates, each of said logic gates having a plurality of inputs coupled to said first decode circuit, and coupled to one of said input buffers for receiving one of said read signals, each of said logic gates providing one of said first decode signals.

16. The writable array logic device according to claim 15 wherein each of said input buffers comprise:

a first ECL gate coupled to one of said input terminals and biased by one of said input signals and providing said first and second pair of output signals; and a second ECL gate coupled to one of said input terminals and biased by one of said input signals and providing said read signal.

17. The writable array logic device according to claim 16 wherein of said logic gates comprise:

a current source;

a plurality of transistors having bases individually coupled to said first decode circuit as said plurality of inputs, collectors coupled to a first voltage, and emitters coupled to a second voltage by said current source; and a first transistor having a base coupled to a reference voltage, an emitter coupled to said emitters of said plurality of transistors, and a collector coupled to one of said rows of collector sensed memory cells and to one of said read signals.

18. The writable array logic device according to claim 17 wherein each of said sense amplifiers comprise:

a first resistor;

a multi-emitter transistor having a plurality of emitters coupled to said second decode circuit, and a base and a collector both coupled to a node;

an emitter follower transistor having a base coupled to said node and coupled to said first voltage by said first resistor, a collector coupled to said first voltage, and an emitter coupled to one of said rows of said emitter sensed memory cells; and fourth means for disabling said sense amplifier coupled to said node and coupled for receiving a write signal.

* * * * *